United States Patent
Morishita

(10) Patent No.: US 6,759,716 B1
(45) Date of Patent: Jul. 6, 2004

(54) INPUT/OUTPUT PROTECTION DEVICE FOR A SEMICONDUCTOR INTEGRATED CIRCUIT

(75) Inventor: Yasuyuki Morishita, Tokyo (JP)

(73) Assignee: NEC Electronics Corporation, Kawasaki (JP)

(*) Notice: Subject to any disclaimer, the term of this patent is extended or adjusted under 35 U.S.C. 154(b) by 0 days.

(21) Appl. No.: 09/619,669

(22) Filed: Jul. 19, 2000

(30) Foreign Application Priority Data

Jul. 19, 1999 (JP) .......................................... 11-204819

(51) Int. Cl.[7] .......................... H01L 23/62; H01L 29/76
(52) U.S. Cl. ..................... 257/357; 257/355; 257/360; 257/372
(58) Field of Search ............................... 257/174, 372, 257/173, 296, 170, 409, 484, 605, 355–363, 578, 591

(56) References Cited

U.S. PATENT DOCUMENTS

| 5,324,982 | A | * | 6/1994 | Nakazato et al. | ............ 257/546 |
| 5,932,914 | A | * | 8/1999 | Horiguchi | ................... 257/355 |
| 5,945,713 | A | * | 8/1999 | Voldman | |
| 6,320,229 | B1 | * | 11/2001 | Uchikoba et al. | ........... 257/355 |

FOREIGN PATENT DOCUMENTS

| JP | 03-184369 | 8/1991 |
| JP | 7-122715 | 5/1995 |
| JP | 8-51188 | 2/1996 |
| JP | 09-036357 | 2/1997 |
| JP | 10-340996 | 12/1998 |

* cited by examiner

*Primary Examiner*—Wael Fahmy
*Assistant Examiner*—Dilinh Nguyen
(74) *Attorney, Agent, or Firm*—McGinn & Gibb, PLLC

(57) ABSTRACT

An input/output protection device of lateral, bipolar type quickly responds to an excess voltage pulse and/or an excess current pulse of, for example, electrostatic discharge. In a region of a first conduction type (a fourth diffusion layer) of a semiconductor substrate, a first diffusion layer of a second conduction type opposite to the first conduction type is fabricated, the layer being connected to an input/output terminal. A second diffusion layer of the second conduction type is fabricated to be connected to electrode wiring at a fixed potential. A third diffusion layer of the second conduction type is manufactured at a bottom of the second diffusion layer and is connected to the second diffusion layer. The first diffusion layer is circularly enclosed with the third diffusion layer. When a high voltage is applied to the input/output terminal, a lateral, bipolar transistor including the first diffusion layer as a collector, the second and third diffusion layers as an emitter, and the region of the first conduction type or the fourth diffusion layer as a base is put to operation.

21 Claims, 5 Drawing Sheets

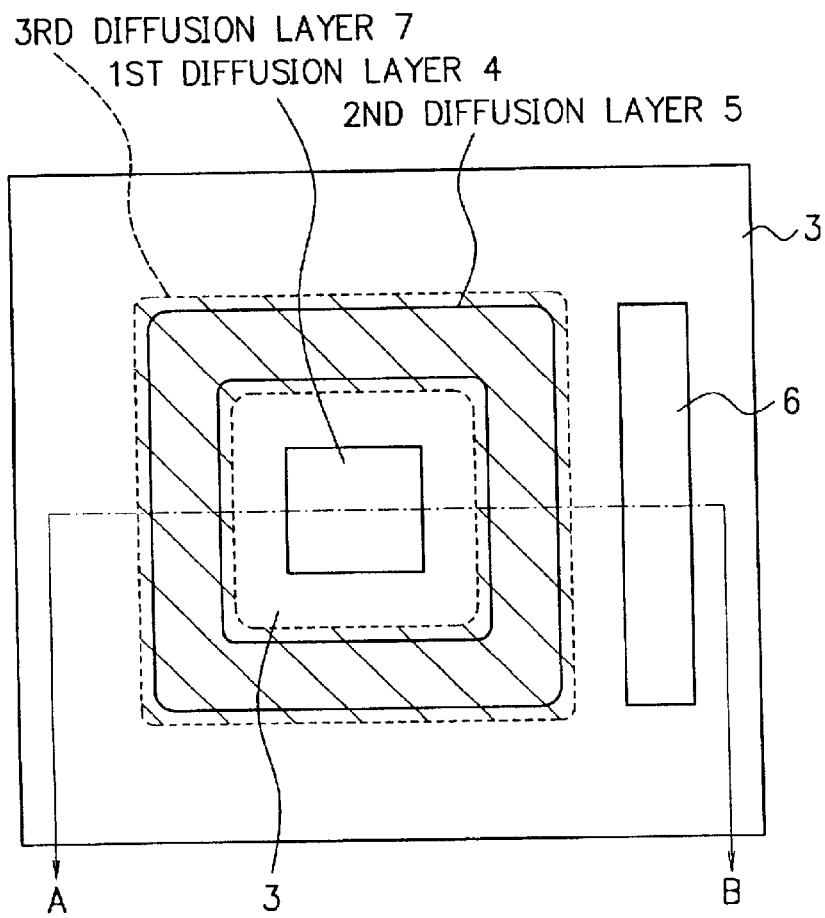
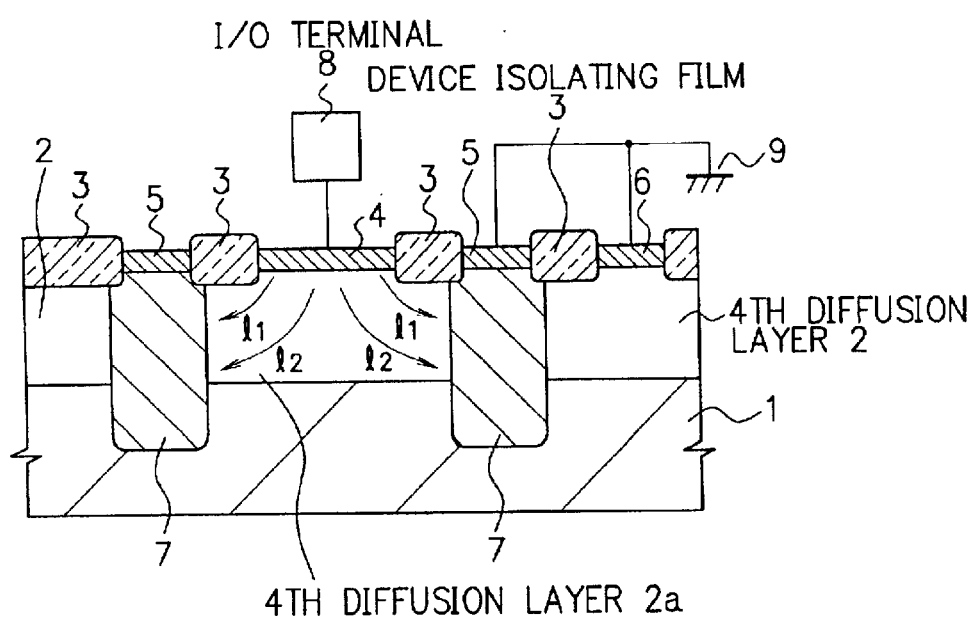

3RD DIFFUSION LAYER 7a  GATE ELECTRODE 10

INPUT/OUTPUT PROTECTION DEVICE FOR A SEMICONDUCTOR INTEGRATED CIRCUIT

BACKGROUND OF THE INVENTION

The present invention relates to an input/output protection device for a semiconductor integrated circuit.

DESCRIPTION OF THE PRIOR ART

In general, since complementary metal oxide semiconductor (CMOS) transistors included in a semiconductor integrated circuit become quite smaller in size, it is increasingly difficult for an input/output protection device for such a semiconductor integrated circuit to protect the device against electrostatic discharge (ESD). That is, when the CMOS transistor including a gate oxide film is reduced in size, the film becomes thinner and hence its dielectric tolerance is decreased. Recently, to reduce parasitic resistance of such a transistor including a diffusion layer, a metal silicidation of the diffusion layer has been applied. This also causes lowering ESD tolerance.

Heretofore, a parasitic lateral type bipolar transistor has been employed as a semiconductor integrated circuit including a CMOS of the prior art. Various techniques of this kind have been proposed in various articles, for example, in the Japanese Patent Laid-Open Nos. 8-51188 and 7-122715.

Referring now to FIGS. 5A and 5B, description will be given of a representative example of an input/output protection device including a bipolar transistor of parasitic lateral type of the prior art. FIG. 5A shows in a plan view the input/output protection device. FIG. 5B is a cross-sectional view thereof along a direction X-Y of FIG. 5A. As can be seen from FIG. 5B, this configuration includes a p-type well layer 102 on a surface of a p-type silicon substrate 101. On a surface of p-type well layer 102, a device isolation film 103 is selectively fabricated.

Moreover, an n-type first diffusion layer 104 is formed on a surface of p-type well layer 102 and an n-type second diffusion layer 105 is manufactured on another surface of p-type well layer 102. The configuration further includes a p-type lead diffusion layer 106. First and second diffusion layers 104 and 105 are manufactured in a process in which a diffusion layer is formed as a source-drain region of a CMOS transistor.

In this structure, first diffusion layer 104 is connected to an input/output terminal 107. Second diffusion layer 105 and diffusion layer 106 are linked with a ground terminal 108.

In the input/output protection device configured as above, when a positive, high-voltage pulse is applied to input/output terminal 107, an avalanche breakdown takes place in a region of junction between first diffusion layer 104 and p-type well layer 102. This causes a breakdown current to flow from input/output terminal 107 to diffusion layer 106. The breakdown current locally increases potential in p-type well layer 102 to operate a bipolar transistor of lateral type including first diffusion layer 104 as a collector, second diffusion layer 105 as an emitter, and p-type well layer 102 as a base. As a result of operation of this transistor, i.e., a parasitic bipolar transistor, ESD current flows from input/output terminal 107 via second diffusion layer 105 as the emitter to ground terminal 108.

Since the degree of integration of semiconductor integrated circuits is increased and its operation speed becomes higher, semiconductor elements of these circuits are decreased in size and the density thereof becomes greater. In general, this resultantly increases the number of defects in the semiconductor elements due to electrostatic discharge (ESD).

The bipolar transistor of parasitic lateral type cannot appropriately respond to a positive high-voltage pulse with a high-speed or a steep rising edge. Consequently, before the protection device starts its functions, a gate oxide film in its internal circuit is possibly destroyed in many cases. As the size of semiconductor integrated circuits is decreased, the gate oxide film becomes thinner and therefore is more easily destroyed.

In the bipolar input/output protection device of lateral type above, the breakdown current after the avalanche breakdown flows through a region of p-type well layer 102 having lower resistance than p-type silicon substrate 101. Therefore, potential of p-type well layer 102 as the base of the bipolar transistor cannot be quickly increased. This leads to a problem of a slow response of the input/output protection device. The goal of the present invention provides to a lateral bipolar type input/output protection device which rapidly responds to an over voltage pulse and/or over current.

SUMMARY OF THE INVENTION

It is therefore an object of the present invention to provide an input/output protection device of a lateral bipolar type having a high response to an excess voltage pulse and/or an excess current pulse associated with, for example, ESD phenomena.

In accordance with the present invention, there is provided an input/output protection device for a semiconductor integrated circuit including a substrate of a first conduction type, an internal circuit, an input/output terminal, electrode wiring, and signal wiring. The device includes a first diffusion layer fabricated in a region of the first conduction type of the semiconductor substrate, the layer having a second conduction type opposite to the first conduction type and being connected to the input/output terminal; a second diffusion layer of the second conduction type connected to the electrode wiring kept, the electrode wiring being at a predetermined potential; and a third diffusion layer of the second conduction type fabricated at a bottom of the second diffusion layer, the third diffusion layer being connected to the second diffusion layer. The first diffusion layer is circularly enclosed with the second and third diffusion layers.

In the configuration, the region of the first conduction type of the semiconductor substrate includes a fourth diffusion layer having an impurity concentration higher than that of the semiconductor substrate. The impurity concentration of the fourth diffusion layer monotonously decreases in a direction from a surface of the semiconductor substrate to an inner section thereof. The third diffusion layer has a depth equal to or more than that of the fourth diffusion layer.

When a high voltage is applied to the input/output terminal, there is formed and is operated a lateral, bipolar transistor including the first diffusion layer as a collector, the second and third diffusion layers as an emitter, and the region of the first conduction type or the fourth diffusion layer as a base.

In the input/output protection device for a semiconductor integrated circuit in accordance with the present invention, the first and second diffusion layers are isolated from each other by a device separating isolation layer on a surface of the semiconductor substrate. Alternatively, the first and second diffusion layers are fabricated with a gate electrode disposed on a surface of the semiconductor substrate. In the structure, the device separating isolation layer or the gate electrode is fabricated in a circular contour.

Additionally, the gate electrode is connected to the signal wiring of the internal circuit of the semiconductor integrated circuit. The gate electrode is fixed to a predetermined potential.

In the input/output protection device for a semiconductor integrated circuit above, the first conduction type is a p type and the second conduction type is an n type, or the first conduction type is an n type and the second conduction type is a p type. The predetermined potential is a potential of a power source.

As above, In the input/output protection device for a semiconductor integrated circuit in accordance with the present invention, the first diffusion layer as the collector region of the parasitic, lateral bipolar transistor is circularly enclosed with the third diffusion layer. Consequently, the breakdown current appearing at occurrence of an avalanche breakdown in a junction region between the first diffusion and the region of the first conduction type flows laterally in the third diffusion layer. This current is however hindered therein and flows in a deep inner region of the semiconductor substrate. In a usual semiconductor substrate which has a low impurity concentration and hence high resistance, when the breakdown current flows in an inner region of the substrate, there occurs a voltage drop by the current. As a result, the potential of the base region, i.e., the fourth diffusion layer of the region or the first conduction type can be easily increased. This facilitates operation of the bipolar transistor. Consequently, the input/output protection device can quickly responds to the excess voltage pulse or the excess current pulse of, for example, ESD phenomena. The device can therefore satisfactorily achieve the protecting operation even when the semiconductor integrated circuit becomes finer in size.

BRIEF DESCRIPTION OF THE DRAWINGS

The objects and features of the present invention will become more apparent from the consideration of the following detailed description taken in conjunction with the accompanying drawings in which:

FIGS. 1A and 1B are a plane view and a cross-sectional view for explaining a first embodiment of an input/output protection device for a semiconductor integrated circuit in accordance with the present invention;

DESCRIPTION OF THE PREFERRED EMBODIMENTS

Figure 2:
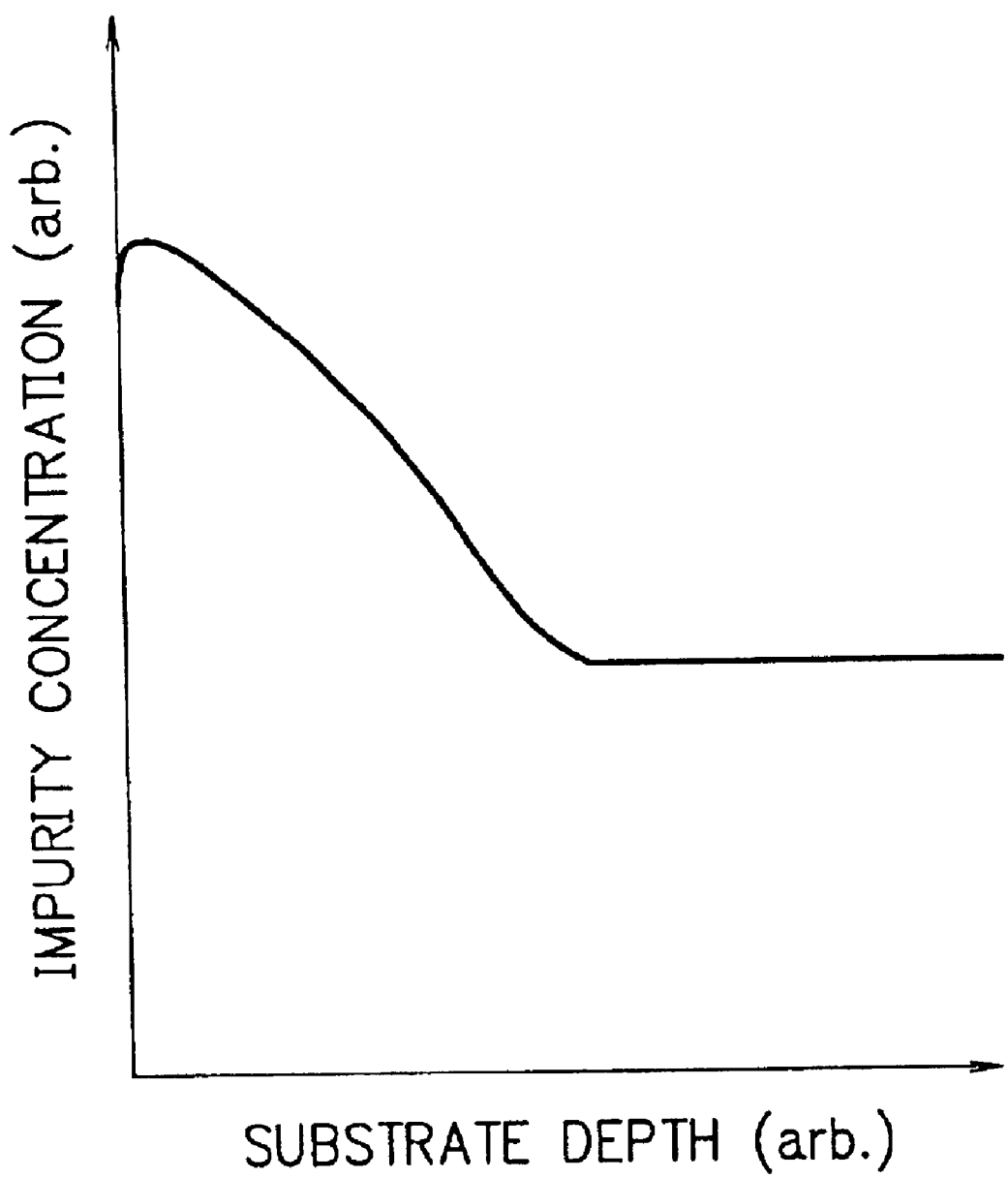
FIG. 2 is a graph showing a distribution of impurity concentration for explaining the first embodiment of the present invention.

Referring next to FIGS. 1A, 1B, and 2, description will be given of a first embodiment in accordance with the present invention. FIG. 1A shows in a plane view an input/output protection device for a semiconductor integrated circuit in accordance with the present invention. FIG. 1B shows in a cross-sectional view a configuration of the input/output device shown in FIG. 1A. FIG. 2 is a graph to explain a distribution of impurity concentration in a region serving as a base of a parasitic, bipolar transistor.

As shown in FIG. 1B, on a surface of a p-type silicon substrate having an impurity concentration of about $10^{15}$ atoms/cm$^3$, a fourth diffusion layer 2, 2a is fabricated in a similar fashion as described in conjunction with the prior art above. The layer 2, 2a has an impurity concentration of about $10^{17}$ atoms/cm$^3$ and a depth of about one micrometer ($\mu$m). On a surface of fourth diffusion layer 2, 2a, a device separating isolation layer 3 is selectively formed as can be seen from FIGS. 1A and 1B. The isolation layer 3 is fabricated by known local oxidation of silicon (LOCOS) or by trench isolation.

Manufactured on a surface of fourth diffusion layer 2, 2a are an n-type first diffusion layer 4 and an n-type second diffusion layer 5. Second diffusion layer 5 is formed to enclose or to surround first diffusion layer 4 as shown in FIG. 1A. There is also fabricated a p-type lead diffusion layer 6. First diffusion layer 4 or second diffusion layer 5 is formed in a process in which a diffusion layer is manufactured as a source-drain region of a CMOS transistor. Namely, the layer has an impurity concentration of about $10^{20}$ atoms/cm$^3$ and a depth of about 0.1 $\mu$m. Depending on cases, a silicide layer may be fabricated on a surface of these diffusion layers.

In accordance with the present invention, as can be seen from FIGS. 1A and 1B, a third diffusion layer 7 as electroconductivity type is formed in a region associated with second diffusion layer 5. Layer 7 is be deeper than fourth diffusion layer 2, 2a. Layer 7 has a conduction type equal to that of second diffusion layer 5. Layer 7 is fabricated in a process in which an n-type well layer is formed in a semiconductor device manufacturing process. In FIG. 1A, region of third diffusion layer 7 is indicated by slant lines for easy explanation.

In this structure, first diffusion layer 4 is connected to an input/output terminal 8 in the same manner as for the prior art. Second diffusion layer 5 and diffusion layer 6 for drawing out or picking up are linked with a ground terminal 9.

In the input/output protection device configured as above, when a positive, high-voltage pulse is applied to input/output terminal 8, an avalanche breakdown occurs in a junction region between first and fourth diffusion layers 4 and 2a. In the constitution of the present invention, a breakdown current caused by the avalanche breakdown flows in a longitudinal direction from first diffusion layer 4 via fourth diffusion layer 2a to silicon substrate 1. That is, as shown in FIG. 1B, fourth diffusion layer 2a is surrounded with third diffusion layer 7, and hence the breakdown current to laterally flow in fourth diffusion layer 2a is hindered.

As above, in accordance with the present invention, the breakdown current flows through silicon substrate 1 into diffusion layer 6. Resultantly, the breakdown current has an elongated path. In addition, silicon substrate 1 is lower in impurity concentration than fourth diffusion layer 2, 2a.

In consequence, in an initial stage of the avalanche breakdown, a voltage drop between a bottom surface of fourth diffusion layer 2a and diffusion layer 6 is increased. This makes it possible to increase the potential of fourth diffusion layer 2a at a higher speed.

Since the potential of fourth diffusion layer 2a is quickly increased by the breakdown current, a lateral, bipolar transistor including fourth diffusion layer 2a as a parasitic base region, first diffusion layer 4 as a collector, and second and third diffusion layers 5 and 7 as an emitter can operate at a higher speed as compared with the prior art.

By the operation of the transistor above, excess charge caused, for example, by ESD on input/output terminal 8 is discharged via second and third diffusion layers 5 and 7 service as the emitter of the transistor into ground terminal 9.

In accordance with the present invention, fourth diffusion layer 2a functioning as the parasitic base region of the transistor is enclosed with third diffusion layer 7. Therefore, the potential of fourth diffusion layer 2a is quickly increased and hence excess charge is discharged at a higher speed, i.e., parasitic bipolar transistor operate quickly. As a result, the semiconductor integrated circuit is completely protected against ESD phenomena.

As shown in FIG. 1B, after the transistor starts its operation, the current flows via path $1_1$ to third diffusion layer 7 as the emitter region. This is because path $1_2$ is longer than path $1_1$. Consequently, parasitic bipolar action can easily occur on a surface area of fourth diffusion layer 2a. Description will next be given of a method of solving the problem above by referring to FIG. 2.

FIG. 2 shows in a graph a distribution of impurity concentration in a depth direction of a zone ranging from a junction plane between fourth and first diffusion layers 2a and 4 to silicon substrate 1. The impurity concentration of fourth diffusion layer 2a, 2 monotonously lowers in a direction toward silicon substrate 1 as shown in FIG. 2.

In the circuit including the configuration of fourth diffusion layer 2, 2a, when the lateral, bipolar transistor operates, the transistor shows an amplification factor (hFE) greater in path $1_1$ than in path $1_2$. Therefore, electrostatic discharge (ESD) takes place without any deviation with respect to the depth direction, namely, uniformly in the direction of depth of third diffusion layer 7. This consequently prevents destruction of the input/output protection device by strong heat produced when the electrostatic discharge locally occurs in a surface area of fourth diffusion layer 2a.

Figure 3A:
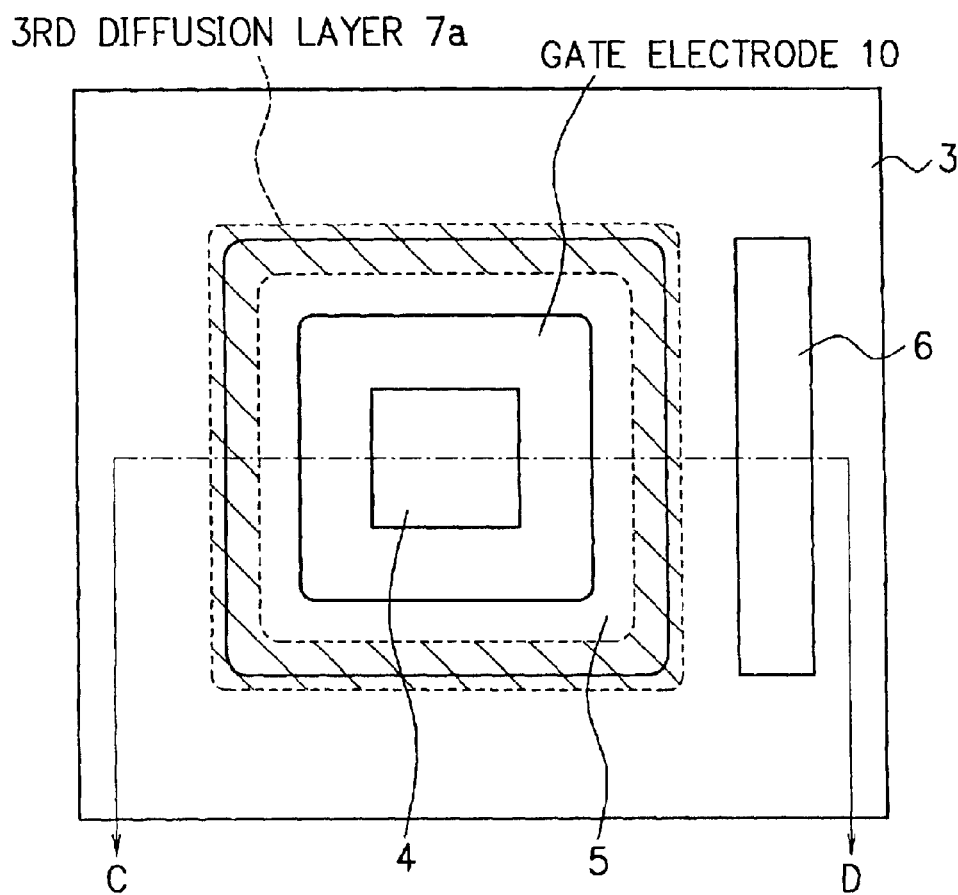
FIGS. 3A and 3B are a plane view and a cross-sectional view for explaining a second embodiment of an input/output protection device for a semiconductor integrated circuit in accordance with the present invention.
Figure 3B:
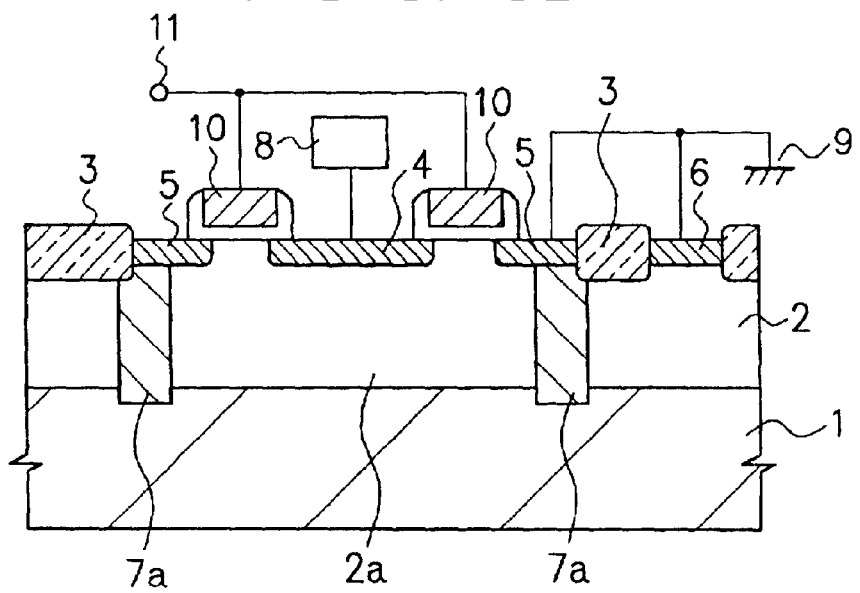

Referring now to FIGS. 3A and 3B, description will be given of a second embodiment of the present invention. FIG. 3A shows in a plane view an input output protection device for a semiconductor integrated circuit in accordance with the present invention. FIG. 3B is a cross-sectional view of the embodiment taken along a line C-D of FIG. 3A. In FIGS. 3A and 3B, the same constituent components as those shown in the first embodiment are assigned with the same reference numeral.

Like in the first embodiment, a fourth diffusion layer 2, 2a is manufactured on a surface of a p-type silicon substrate 1 as shown in FIG. 3B. On a surface of fourth diffusion layer 2, 2a, a device separating isolation layer 3 is selectively formed as can be seen from FIGS. 3A and 3B.

On p-type well region 2, a gate electrode 10 having a closed ring shape is fabricated with a gate isolating film therebetween as shown in FIGS. 3A and 3B. An n-type first diffusion layer 4 and an n-type second diffusion layer 5 are formed to match with a pattern of gate electrode 10. First diffusion layer 4 and/or second diffusion layer 5 is (are) employed as diffusion layers for a source-drain region of an MOS transistor.

The configuration further includes a p-type lead diffusion layer 6. As can be seen from FIGS. 3A and 3B, a third diffusion layer 7a is fabricated in a partial region over second diffusion layer 5. Layer 7a is deeper than fourth diffusion layer 2, 2a. Third diffusion layer 7a is equal in conduction type to second diffusion layer 5. In FIG. 3A, an area of third diffusion layer 5 is hatched for easy understanding.

In this configuration, first diffusion layer is connected to an input/output terminal 8 in almost the same way as for the first embodiment. Second diffusion layer 5 and diffusion layer 6 are coupled with a ground terminal 9.

In the input/output protection device configured as above, when a positive, high-voltage pulse is applied to input/output terminal 8 as described in conjunction with the first embodiment, potential of fourth diffusion layer 2a to serve as a base region of a transistor is quickly increased by a breakdown current as above. This results in quick parasitic bipolar action of excess charge from input/output terminal 8. The semiconductor integrated circuit is therefore completely protected against ESD phenomena.

In the structure of the second embodiment, when input/output terminal 8 is used as an input terminal, gate electrode 10 is connected to a fixed terminal 11. Fixed terminal 11 is set to a ground potential. Conversely, when input/output terminal 8 is used as an output terminal, gate electrode 10 is connected to an internal circuit of the semiconductor integrated circuit.

Figure 4:
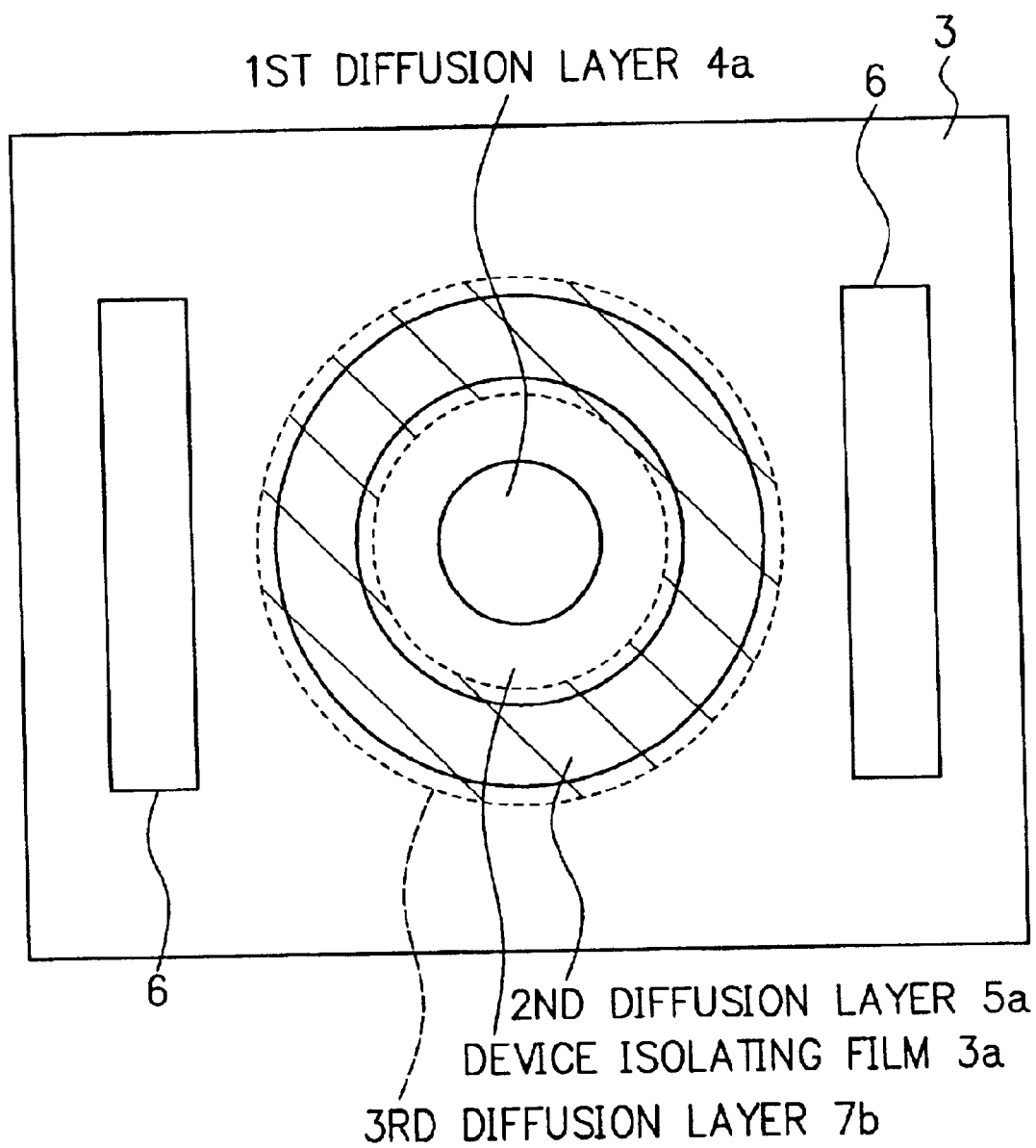
FIG. 4 is a plane view of an input/output protection device for explaining a third embodiment in accordance with the present invention.
Figure 5A:
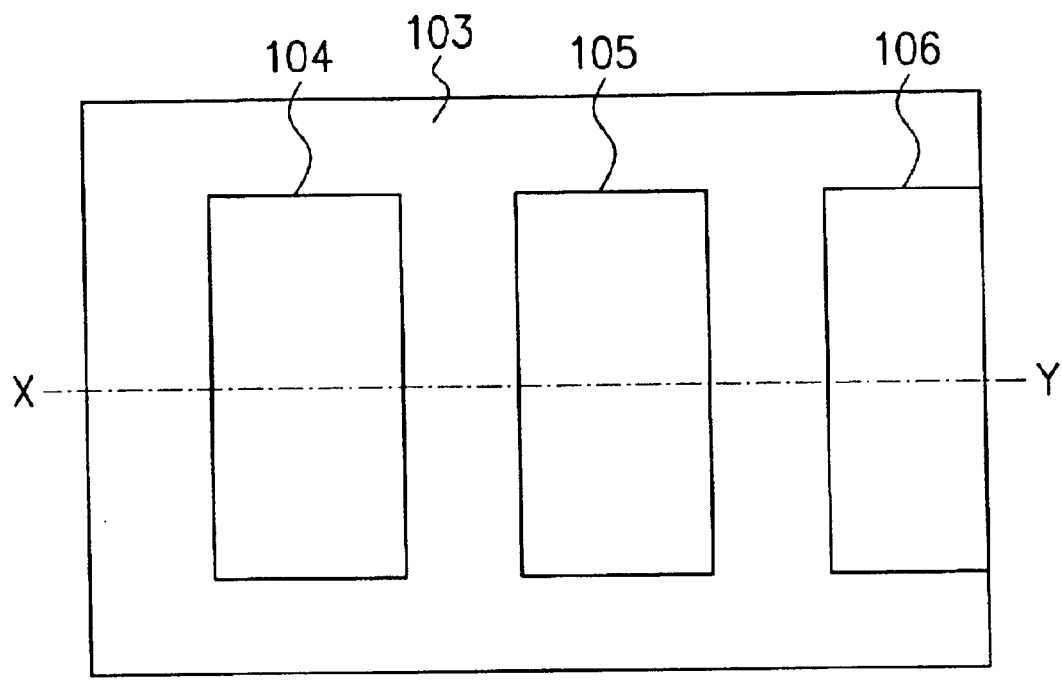
FIGS. 5A and 5B are a plane view and a cross-sectional view for explaining a first embodiment of an input/output protection device in the prior art.
Figure 5B:
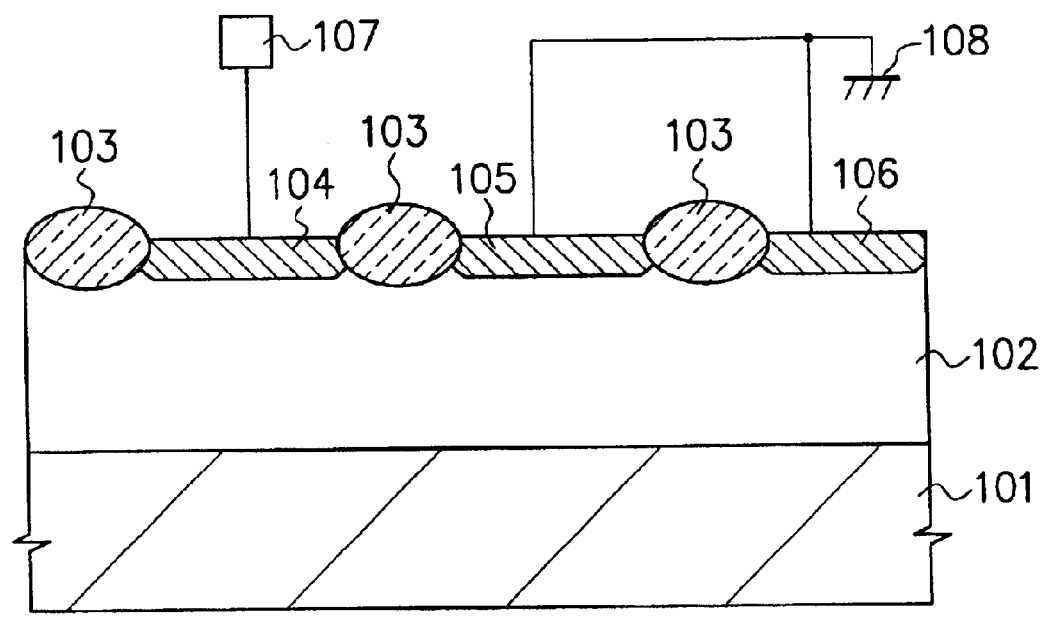

Next, description will be given of a third embodiment of the present invention by referring to FIG. 4. FIG. 4 shows in a plane view an input/output protection device for a semiconductor integrated circuit in accordance with the present invention. The third embodiment differs in a pattern of the plane view from the first embodiment. These embodiments are in the cross-sectional configuration almost equal to the first embodiment. In FIG. 4, the same constituent components as those of the first embodiment are assigned with the same reference numerals.

Like in the first embodiment, a fourth diffusion layer 2a is formed on a surface of a p-type silicon substrate and a device separating isolation film 3, 3a is selectively manufactured on a surface of the fourth diffusion layer as shown in FIG. 4. On a p-type well region, device separating isolation film 3a is formed in a closed ring shape as can be seen from FIG. 4. There are fabricated an n-type first diffusion layer 4a and an n-type second diffusion layer 5a to match with a pattern of device separating isolation film 3a.

The configuration further includes a p-type lead diffusion layer 6. A third diffusion layer 7b is manufactured in an area over second diffusion layer 5a. Layer 7b is deeper than fourth diffusion layer. Third and second diffusion layers 7b and 5a are equal in the conduction type to each other. In FIG. 4, an area of third diffusion layer 7b is hatched for easy explanation.

In this structure, first diffusion layer 4a is connected to an input/output terminal as shown in the configuration of the first embodiment. Second diffusion layer 5a and diffusion layer 6 are linked with a ground terminal.

The third embodiment leads to an advantage similar to that of the first embodiment. In this situation, first diffusion layer 4a has a circular periphery. Therefore, the avalanche breakdown described for the first embodiment uniformly takes place in the periphery of first diffusion layer 4a. This accordingly prevents the local electrostatic discharge in a surface area of the forth diffusion layer and hence completely protects the input/output protection device against destruction by strong heat.

In the description of the embodiments above, the input/output protection device is formed on a p-type silicon substrate. This however does not restrict the present invention. Namely, the present invention is also applicable to an n-type silicon substrate. However, in this case, the conduction type described above must be reversed. Moreover, ground terminal 9 and fixed terminal 11 must be replaced with a power source terminal. In this case, the semiconductor devices are effectively protected against a negative, high-voltage pulse. The present invention is also applicable even when the input/output protection device is fabricated in a p-type well or in an n-type well.

In the embodiments above, the fourth diffusion layer has a higher impurity concentration than the silicon substrate. However, the present invention can be similarly applied even when the fourth diffusion layer is absent in the configuration. In this case, the parasitic base region is a surface area of the silicon substrate.

In accordance with the present invention, first diffusion layer 4 may be enclosed in a ring shape with third diffusion layer 7 and a deep device separating isolation film. This device separating isolation film is different from device separating isolation film 3 and is almost equal in depth to diffusion layer 7 prescribed the third embodiment.

Also in this situation, the breakdown current at occurrence of the avalanche breakdown in a junction region between the first diffusion layer and the region of the first conduction type laterally flows in deep third diffusion layer 7b and the deep device separating isolation film. However, the breakdown current is hindered and flows deep in an inner section of the semiconductor substrate. Consequently, as in the embodiments above, the absolute value of potential of the fourth diffusion layer of the region of the first conduction type as the base region can be easily increased. Namely, this easily causes the bipolar operation.

As above, in the input/output protection device for a semiconductor integrated circuit in accordance with the present invention, in a region of a first conduction type or a fourth diffusion layer of a semiconductor substrate, a first diffusion layer of a second conduction type opposite to the first conduction type is formed and is connected to an input output terminal and a second diffusion layer of the second conduction type is fabricated to be connected to electrode wiring at a fixed potential. At a bottom of the second diffusion layer, a third diffusion layer of the second conduction type is manufactured and is connected to the second diffusion layer. The first diffusion layer is circularly enclosed with the second and third diffusion layers.

When a high voltage is applied to the input/output terminal, a lateral, bipolar transistor including the first diffusion layer as a collector, the second and third diffusion layers as an emitter, and the region of the first conduction type or the fourth diffusion layer as a base is formed and is put to operation. The operation of the transistor causes ESD phenomena.

Thus, in order to the electrostatic discharge, the input/output protection device quickly responds to an excess voltage externally applied to the input terminal. This increases the protective function of the protection device for the semiconductor integrated circuit.

To increase the degree of integration and/or the operation speed in a semiconductor integrated circuit, the constituent semiconductor devices become smaller in size and density thereof is increased in the semiconductor integrated circuit. Even in this situation, defects which may be caused in semiconductor devices by ESD phenomena or the like can be easily prevented in accordance with the present invention.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An input/output protection device for a semiconductor integrated circuit having a substrate of a first conduction type, an internal circuit, an input/output terminal, electrode wiring, and signal wiring, said protection device comprising:

a first region of a first diffusion layer fabricated in a region of the first conduction type of the semiconductor substrate, the first diffusion layer having a second conduction type opposite the first conduction type, said first region being connected to the input/output terminal;

a second region of said first diffusion layer of the second conduction type being hold at a predetermined potential; and a third region having a diffusion layer of the second conduction type fabricated at a bottom of the second region, the third region being connected to the second region of said first diffusion layer, said third region being fabricated at a location other than at a bottom of said first diffusion layer of said first region, the first region being circularly enclosed by the second and third regions, said first region, said second region, and said third region thereby forming a parasitic bipolar transistor in which said first region serves as a collector thereof and said second region and said third region serve as an emitter thereof.

2. An input/output protection device in accordance with claim 1, wherein the region of the first conduction type of the semiconductor substrate includes a fourth diffusion layer having an impurity concentration higher than that of the semiconductor substrate.

3. An input/output protection device in accordance with claim 2, wherein the impurity concentration of the fourth diffusion layer monotonously decreases in a direction from a surface of the semiconductor substrate to an inner section thereof.

4. An input/output protection device in accordance with claim 3 wherein the third diffusion layer has a depth equal to or more than that of the fourth diffusion layer.

5. An input/output protection device in accordance with claim 3, wherein a lateral, bipolar transistor including the first diffusion layer as a collector, the second and third diffusion layers as an emitter, and the region of the first conduction type or the fourth diffusion layer as a base is put to operation.

6. An input/output protection device in accordance with claim 3, wherein the first and second diffusion layers are isolated from each other by a device separating isolation layer on a surface of the semiconductor substrate.

7. An input/output protection device in accordance with claim 2, wherein the third diffusion layer has a depth equal to or more than that of the fourth diffusion layer.

8. An input/output protection device in accordance with claim 7, wherein a lateral, bipolar transistor including the first diffusion layer as a collector, the second and third diffusion layers as an emitter, and the region of the first conduction type or the fourth diffusion layer as a base is put to operation.

9. An input/output protection device in accordance with claim 7, wherein the first and second diffusion layers are isolated from each other by a device separating isolation layer on a surface of the semiconductor substrate.

10. An input/output protection device in accordance with claim 2, wherein a lateral, bipolar transistor including the first diffusion layer as a collector, the second and third diffusion layers as an emitter, and the region of the first conduction type or the fourth diffusion layer as a base is put to operation.

11. An input/output protection device in accordance with claim 2, wherein the first and second diffusion layers are isolated from each other by a device separating isolation layer on a surface of the semiconductor substrate.

12. An input/output protection device in accordance with claim 1, wherein a lateral, bipolar transistor including the first diffusion layer as a collector, the second and third diffusion layers as an emitter, and the region of the first conduction type or the fourth diffusion layer as a base is put to operation.

13. An input/output protection device in accordance with claim 12, wherein the first and second diffusion layers are isolated from each other by a device separating isolation layer on a surface of the semiconductor substrate.

14. An input/output protection device in accordance with claim 1, wherein the first and second diffusion layers are isolated from each other by a device separating isolation layer on a surface of the semiconductor substrate.

15. An input/output protection device in accordance with claim 14, wherein the device separating isolation layer or the gate electrode is fabricated in a circular shape.

16. An input/output protection device in accordance with claim 1, wherein the first and second diffusion layers are maw re with a gate electrode disposed on a surface of the semiconductor substrate.

17. An input/output protection device in accordance with claim 16, wherein the gate electrode is connected to the signal wring of the internal circuit of the semiconductor integrated circuit.

18. An input/output protection device in accordance with claim 16, wherein the gate electrode is fixed to a predetermined potential.

19. An input/output protection device in accordance with claim 1, wherein:

the first conduction type is a p type and the second conduction type is an n type; and the predetermined potential is a ground potential.

20. An input/output protection device in accordance with claims 1, wherein:

the first conduction type is an n type and the second conduction type is a p type; and the predetermined potential is a potential of a power source.

21. The protection device of claim 1, wherein a protection of said internal circuit occurs by an avalanche breakdown in which said first diffusion layer connected to said input/output terminal serves as a collector and said second and third diffusion layers serve as an emitter for a lateral bipolar transistor.

* * * * *